US007312498B2

(12) United States Patent
Ozawa

(10) Patent No.: US 7,312,498 B2
(45) Date of Patent: Dec. 25, 2007

(54) NONVOLATILE SEMICONDUCTOR MEMORY CELL AND METHOD OF MANUFACTURING THE SAME

(75) Inventor: Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 66 days.

(21) Appl. No.: 11/331,228

(22) Filed: Jan. 13, 2006

(65) Prior Publication Data

US 2006/0114736 A1    Jun. 1, 2006

Related U.S. Application Data

(62) Division of application No. 10/791,870, filed on Mar. 4, 2004, now Pat. No. 7,015,539.

(30) Foreign Application Priority Data

Jan. 5, 2004     (JP) .............................. 2004-000518

(51) Int. Cl.
*H01L 29/788* (2006.01)
(52) U.S. Cl. ............... 257/317; 257/315; 257/E21.209; 257/E21.422; 257/E29.129; 257/E29.165; 438/260
(58) Field of Classification Search ................ 257/317, 257/E21.209
See application file for complete search history.

(56) References Cited

U.S. PATENT DOCUMENTS 5,869,858 A    2/1999  Ozawa et al.

| | | |
|---|---|---|
| 6,153,904 A | 11/2000 | Yang |
| 6,441,429 B1 | 8/2002 | Hsieh et al. |
| 6,649,965 B2 | 11/2003 | Takada et al. |
| 6,693,321 B1 | 2/2004 | Zheng et al. |
| 2002/0149974 A1 | 10/2002 | Sato et al. |

(Continued)

FOREIGN PATENT DOCUMENTS

JP           4-167325          6/1992

(Continued)

OTHER PUBLICATIONS

Foreign Patent Office Notification For Filing Opinion in application 10-2005-0000514 and English language translation thereof.

(Continued)

*Primary Examiner*—Tu-Tu Ho
(74) *Attorney, Agent, or Firm*—Finnegan, Henderson, Farabow, Garrett & Dunner, L.L.P.

(57) ABSTRACT

A stacked-gate structure includes a tunnel insulation film, a floating gate electrode, an inter-electrode insulation film and a control gate electrode, which are stacked on a semiconductor substrate. The inter-electrode insulation film has a three-layer structure that includes a first oxidant barrier layer, an intermediate insulation layer and a second oxidant barrier layer. Gate side-wall insulation films are formed on both side surfaces of the stacked-gate structure. The thickness of the gate side-wall insulation film increases, at a side portion of the floating gate electrode, from the inter-electrode insulation film side toward the tunnel insulation film side. The width of the floating gate electrode in a channel length direction decreases from the inter-electrode insulation film side toward the tunnel insulation film side.

12 Claims, 5 Drawing Sheets

U.S. PATENT DOCUMENTS

2003/0143814 A1   7/2003   Bicksler et al.
2004/0033653 A1   2/2004   Kim et al.

FOREIGN PATENT DOCUMENTS

| | | |
|---|---|---|
| JP | 7-249697 | 9/1995 |
| JP | 09-167807 | 6/1997 |
| JP | 09-167807 A * | 6/1997 |
| JP | 2725575 | 12/1997 |
| JP | 10-32313 | 2/1998 |
| JP | 10-65028 | 3/1998 |
| JP | 10-335500 | 12/1998 |
| JP | 2003-197873 | 7/2003 |
| KR | 0152318 | 12/1998 |
| KR | 2003-70967 | 9/2003 |

OTHER PUBLICATIONS

Notification of Reasons for Rejection dated Jan. 30, 2007, in Japanese Patent Application No. 2004-000518 and English language translation thereof.

* cited by examiner

NONVOLATILE SEMICONDUCTOR MEMORY CELL AND METHOD OF MANUFACTURING THE SAME

CROSS-REFERENCE TO RELATED APPLICATIONS

This application is a divisional of application Ser. No. 10/791,870, filed Mar. 4, 2004 now U.S. Pat. No. 7,015,539, which is incorporated herein by reference and is based upon and claims the benefit of priority from prior Japanese Patent Application No. 2004-000518, filed Jan. 5, 2004, the entire contents of which are incorporated herein by reference.

BACKGROUND OF THE INVENTION

1. Field of the Invention

The present invention relates generally to a stacked-gate nonvolatile semiconductor memory cell in which a floating gate electrode and a control gate electrode are stacked, and a method of manufacturing the same. In particular, the invention relates to a nonvolatile semiconductor memory cell, which is effectively applicable to a case where an inter-electrode insulation film lying between a floating gate electrode and a control gate electrode has a substantially flat structure, and to a method of manufacturing the same.

2. Description of the Related Art

In the prior art, a stacked-gate memory cell, which has a stacked-gate structure wherein a floating gate electrode and a control gate electrode are stacked, has widely been used as an electrically programmable nonvolatile semiconductor memory cell. In order to increase a cell coupling ratio in this memory cell, a method has been proposed wherein the stacked-gate structure is formed in an inverse-taper shape.

FIG. 7A and FIG. 7B illustrate this type of memory cell structure. FIG. 7A is a cross-sectional view taken in a channel length direction, and FIG. 7B is a cross-sectional view taken in a channel width direction. In the Figures, reference numeral 201 denotes a silicon substrate, numeral 202 a tunnel insulation film, numeral 203 a floating gate electrode formed of a polysilicon layer, numeral 204 a buried insulation film for device isolation, numeral 205 an inter-electrode insulation film, numeral 206 a control gate electrode formed of a polysilicon layer, and numeral 207 source/drain diffusion layers. The stacked-gate structure is formed in an inverse-taper shape, and the source/drain diffusion layers 207 are formed using an oblique ion implantation method with an incidence angle of 5°.

In the above-described structure, an area off the floating gate electrode 203, which contacts the inter-electrode insulation film 205 is greater than an area of the floating gate electrode 203, which contacts the tunnel insulation film 202. Thus, the cell coupling ratio increases. Accordingly, the write/erase operation voltage can be decreased.

However, this type of memory cell has the following problems. The width of the substrate-side part of the floating gate electrode is less than a normal width of the dell, and the oblique ion implantation is used. As a result, the channel width of the cell transistor becomes much less than the cell width. If the cell size is reduced, the short channel effect becomes conspicuous and it becomes difficult to control the threshold voltage value. Furthermore, if a vertical ion implantation method is substituted for the oblique ion implantation method in forming the source/drain diffusion layers 207 in order to suppress the short channel effect, the shapes of finished diffusion layers 207 would vary from cell to cell. In this case, too, it becomes difficult to control the threshold voltage value.

In the cell structure shown in FIGS. 7A and 7B, the stacked-gate structure has an inverse-taper shape. As a result, a so-called "void" occurs when the insulation film 204 is buried between cells. It is difficult to completely bury the insulation film 204 between cells. Consequently, the reliability of cells deteriorates.

As has been described above, in the conventional stacked-gate nonvolatile semiconductor memory cell, if the stacked-gate structure is formed in the inverse-taper shape in order to increase the cell coupling ratio, the control of the threshold voltage becomes difficult due to the short channel effect, and this may lead to a data write malfunction.

BRIEF SUMMARY OF THE INVENTION

According to an aspect of the present invention, there is provided a nonvolatile semiconductor memory cell comprising: a semiconductor substrate; a stacked-gate structure that includes a tunnel insulation film, a floating gate electrode, an inter-electrode insulation film and a control gate electrode, which are stacked on the semiconductor substrate, the inter-electrode insulation film having a three-layer structure that includes a first oxidant barrier layer, an intermediate insulation layer and a second oxidant barrier layer; and gate side-wall insulation films formed on both side surfaces of the stacked-gate structure, wherein the thickness of the gate side-wall insulation film increases, at a side portion of the floating gate electrode, from the inter-electrode insulation film side toward the tunnel insulation film side, and the width of the floating gate electrode in a channel length direction decreases from the inter-electrode insulation film side toward the tunnel insulation film side.

According to another aspect of the invention, there is provided a nonvolatile semiconductor memory cell comprising: a semiconductor substrate; a stacked-gate structure that includes a tunnel insulation film, a floating gate electrode, an inter-electrode insulation film and a control gate electrode, which are stacked on the semiconductor substrate, the inter-electrode insulation film having a three-layer structure that includes a first oxidant barrier layer, an intermediate insulation layer and a second oxidant barrier layer; and gate side-wall insulation films formed on both side surfaces of the stacked-gate structure, wherein the width of the floating gate electrode in a channel length direction is 50 nm or less on a surface of the tunnel insulation film, and the thickness of the gate side-wall insulation film increases, at a side portion of the floating gate electrode, from the inter-electrode insulation film side toward the tunnel insulation film side, and the width of the floating gate electrode in the channel length direction decreases from the inter-electrode insulation film side toward the tunnel insulation film side.

According to still another aspect of the invention, there is provided a method of manufacturing a nonvolatile semiconductor memory cell, comprising: forming a tunnel insulation film on a semiconductor substrate; forming on the tunnel insulation film a first conductive layer that becomes a floating gate electrode; forming on the first conductive layer an inter-electrode insulation film that includes a first oxidant barrier layer, which suppresses passage of oxidant, an intermediate insulation layer, and a second oxidant barrier layer, which suppresses passage of oxidant; forming on the inter-electrode insulation film a second conductive layer that becomes a control gate electrode; forming a stacked-gate structure by selectively etching the first conductive layer, the second conductive layer and the inter-electrode insulation film; and forming gate side-wall insulation films on side parts of the floating gate electrode by oxidizing or oxynitriding side surfaces of the stacked-gate structure, each of the gate side-wall insulation films having a thickness increasing from the inter-electrode insulation film side toward the tunnel insulation film side.

According to still another aspect of the invention, there is provided a method of manufacturing a nonvolatile semiconductor memory cell, comprising: forming a tunnel insulation film on a semiconductor substrate; forming on the tunnel insulation film a first conductive layer that becomes a floating gate electrode; forming on the first conductive layer an inter-electrode insulation film that includes a first oxidant barrier layer, which suppresses passage of oxidant, an intermediate insulation layer, and a second oxidant barrier layer, which suppresses passage of oxidant; forming on the inter-electrode insulation film a second conductive layer that becomes a control gate electrode lower-layer; forming a third oxidant barrier layer on the second conductive layer; forming a stacked-gate structure by selectively etching the first conductive layer, the second conductive layer, the inter-electrode insulation film and the third oxidant barrier layer; forming first gate side-wall insulation films on side parts of the floating gate electrode and second gate side-wall insulation films on side parts of the control gate electrode lower-layer by oxidizing or oxynitriding side surfaces of the stacked-gate structure, each of the first gate side-wall insulation films having a thickness increasing from the inter-electrode insulation film side toward the tunnel insulation film side, and each of the second gate side-wall insulation films having a thickness decreasing from a central part thereof toward the oxidant barrier layers; and removing the third oxidant barrier layer and then forming on the control gate electrode lower-layer a control gate electrode upper-layer that has a lower resistance than the control gate electrode lower-layer.

According to still another aspect of the invention, there is provided a memory card comprising: a memory chip including a plurality of nonvolatile memory cells, and a controller that controls the memory chip, the memory chip and the controller being mounted on a single wiring board, wherein the memory cell comprises: a stacked-gate structure that includes a tunnel insulation film, a floating gate electrode, an inter-electrode insulation film and a control gate electrode, which are stacked on a semiconductor substrate, the inter-electrode insulation film having a three-layer structure that includes a first oxidant barrier layer, an intermediate insulation layer and a second oxidant barrier layer; and gate side-wall insulation films formed on both side surfaces of the stacked-gate structure, wherein the thickness of the gate side-wall insulation film increases, at a side portion of the floating gate electrode, from the inter-electrode insulation film side toward the tunnel insulation film side, and the width of the floating gate electrode in a channel length direction decreases from the inter-electrode insulation film side toward the tunnel insulation film side.

DETAILED DESCRIPTION OF THE INVENTION

An embodiment of the present invention will now be described with reference to the accompanying drawings.

EMBODIMENT

Figure 1A:
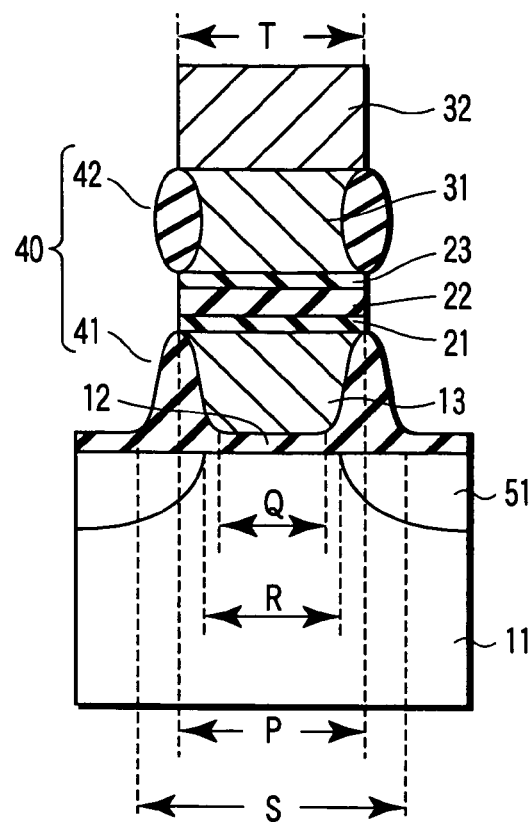
FIG. 1A is a cross-sectional view taken in a channel length (bit line) direction, which illustrates a schematic structure of a nonvolatile semiconductor memory cell according to an embodiment of the present invention.
Figure 1B:
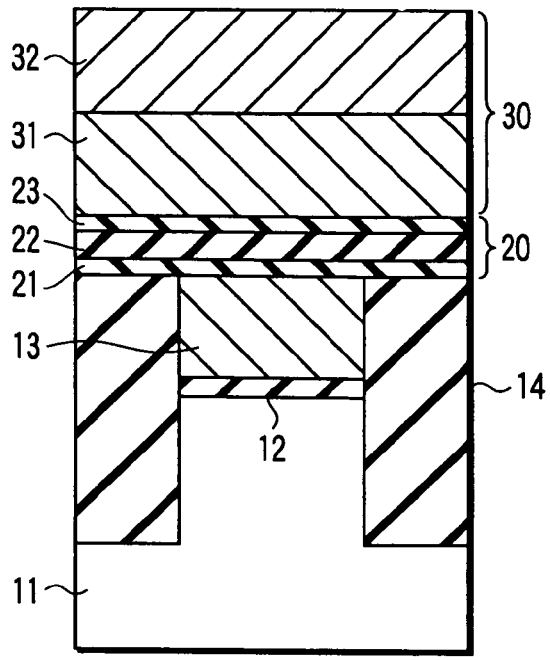
FIG. 1B is a cross-sectional view taken in a channel width (word line) direction, which illustrates a schematic structure of the nonvolatile semiconductor memory cell according to the embodiment of the present invention.

FIG. 1A is a cross-sectional view taken in a channel length (bit line) direction, which illustrates a schematic structure of a nonvolatile semiconductor memory cell according to an embodiment of the present invention, and FIG. 1B is a cross-sectional view taken in a channel width (word line) directions which illustrates a schematic structure of the nonvolatile semiconductor memory cell according to the embodiment.

A floating gate 13 is formed on a silicon substrate (semiconductor substrate) 11 via a tunnel insulation film 12. A device isolation insulation film 14 is buried between floating gate electrodes 13 that are adjacent to each other in the word line direction. The device isolation insulation film 14 is also buried in a groove that is formed by partially etching a surface portion of the substrate 11. An upper surface of the floating gate electrode 13 and an upper surface of the device isolation insulation film 14 are covered with an inter-electrode insulation film 20 and a control gate electrode 30 which have substantially flat structures.

The inter-electrode insulation film 20 has a three-layer structure that comprises a first oxidant barrier layer 21, which suppresses passage of oxidant, an intermediate insulation film 22 and a second oxidant barrier layer 23, which suppresses passage of oxidant. The control gate electrode 30 has a two-layer structure that comprises a control gate electrode lower-layer 31 and a control gate electrode upper-layer 32 that has a lower resistance than the lower-layer 31.

Gate side-wall insulation films 40 are formed on side surfaces of the stacked-gate structure that comprises the floating gate electrode 13, inter-electrode insulation film 20 and control gate electrode 30. To be more specific, first side-wall insulation films 41 are formed on side walls of the floating gate electrode 13, and second side-wall insulation films 42 are formed on side walls of the control gate electrode lower-layer 31. Source/drain diffusion layer 51 are formed in a substrate surface portion.

The width of the floating gate electrode 13 in the channel length direction (bit line direction) monotonously-increases from the tunnel insulation film 12 side toward the inter-electrode insulation film 20 side. In addition, the thickness of the side-wall insulation film 41 monotonously-decreases from the tunnel insulation film 12 side toward the inter-electrode insulation film 20. Further, the side-wall insulation film 42 is thin at the lower and upper surfaces of the control gate lower-layer 31, and is thick at the central part of the control gate lower-layer 31. Thus, the area of contact between the upper surface of the control gate electrode lower-layer 31 and the lower surface of the control gate electrode upper-layer 32 is made substantially equal to the area of contact between the lower surface of the control gate electrode lower-layer 31 and the inter-electrode insulation film 20.

In FIG. 1A, a distance P indicates the width of that part of the floating gate electrode 13 in the channel length direction, which contacts the inter-electrode insulation film 20. The distance P corresponds to a distance between top portions of two side-wall insulation films 41 that sandwich the floating gate electrode 13. The distance P is substantially equal to a cell width T that is the width of the stacked-gate structure. In FIG. 1A, a distance Q indicates the width of that part of the floating gate electrode 13, which contacts the tunnel insulation film 12. The distance Q corresponds to a distance between bottom portions of two side-wall insulation films 41 that sandwich the floating gate-electrode 13 (i.e. a distance between end portions of two side-wall insulation films 41, which are located on the floating gate electrode 13 side). In this embodiment, the relationship, P>Q, is established.

In FIG. 1A, a distance R is the channel length. A distance S indicates a distance between bottom portions of two side-wall insulation films 41 that sandwich the floating gate electrode 13 (i.e. a distance between end portions of two side-wall insulation films 41, which are located on a side opposed to the floating gate electrode 13). In the present embodiment, the distance S is greater than the width (cell width T) of the stacked-gate structure. The channel length R becomes the relation of R<S and becomes the relation of Q<R<S desirably.

Figure 2:
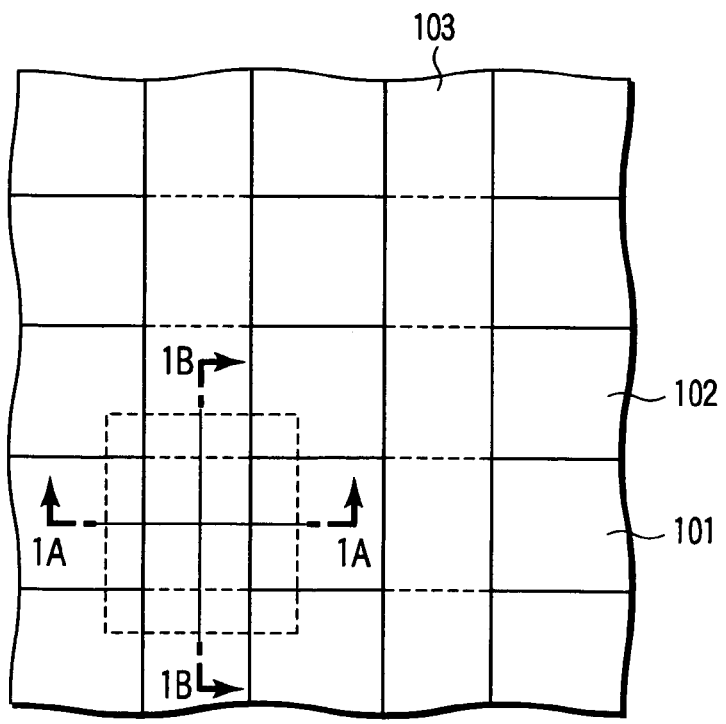
FIG. 2 is a plan view that schematically shows the basic structure of a NAND cell using the nonvolatile semiconductor memory cell according to this embodiment.

The cell is used as a unit cell of, e.g. a NAND cell unit, as shown in a plan view of FIG. 2. FIG. 1A is a cross-sectional view taken along line 1A-1A in FIG. 2, and FIG. 1B is a cross-sectional view taken along line 1B-1B in FIG. 2. In FIG. 2, numeral 101 denotes a device formation region, numeral 102 a device isolation region, and numeral 103 a gate wiring layer (word line). Although not shown, the bit line is disposed perpendicular to the word line.

With the above-described memory cell structure, since the area of the inter-electrode insulation film 20 is made greater than that of the tunnel insulation film 12, the cell coupling ratio increases. Further, since the distance between the source/drain diffusion layers 51 is increased, the short channel effect can be suppressed and the cell threshold voltage value can easily be controlled.

The cell coupling ratio ($\alpha$) is a ratio of a voltage Vox that is applied to the tunnel insulation film to a voltage Vcg that is applied to the control gate electrode, and it is defined by $\alpha = Vox/Vcg$.

In general, using a tunnel insulation film capacitance C1 and an inter-electrode insulation film capacitance C2 of the cell, the cell coupling ratio $\alpha$ is expressed by $\alpha = C2/(C1+C2)$.

In the conventional structure wherein the stacked-gate structure is formed in the inverse-taper shape, the short channel effect becomes conspicuous when the floating gate electrode width Q decreases 50 nm or less. By contrast, in the present embodiment, even when the floating gate electrode width Q is 50 nm or less, the distance S is greater than the distance Q and thus the short channel effect can be suppressed. Experiments conducted by the inventors of the present invention have confirmed that even when the floating gate electrode width Q is 50 nm or less, if a condition, $S \geq 1.3Q$, is established, the short channel effect can fully be suppressed.

Figure 3:
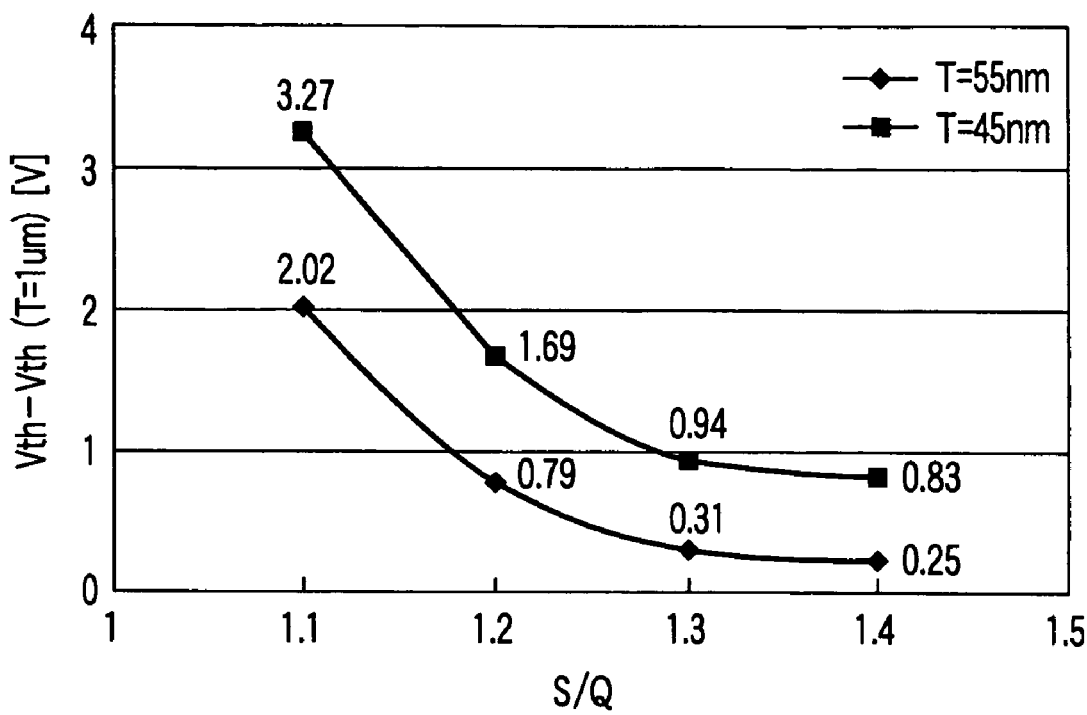
FIG. 3 is a characteristic graph showing measured results of short channel effect in cases where the cell width T is 55 nm and the cell width T is 45 nm.

FIG. 3 shows measurement results of the short channel effect. The measurement results relate to a case where the cell width T is set at 55 nm and a case where the cell width T is set at 45 nm. With respect to each case, the thickness of the gate side-wall insulation film was varied, and cells with different values of S/Q were formed. The cell threshold voltage values Vth of the formed cells were plotted. In FIG. 3, the ordinate indicates the difference between the cell threshold voltage value Vth and a cell threshold voltage value Vth (T=1 µm) with the cell width of 1 µm on the same wafer. It is understood that when the value S/Q is 1.3 or more, the short channel effect is sufficiently suppressed.

The width Q of the lower portion of the floating gate electrode, which is the data point, varies depending on the gate side-wall insulation film thickness, as shown in TABLE 1.

TABLE 1

| S/Q | T = 55 nm | T = 45 nm |
| --- | --- | --- |
| 1.1 | Q = 52.3 nm | Q = 42.8 nm |
| 1.2 | Q = 49.5 nm | Q = 40.5 nm |
| 1.3 | Q = 46.8 nm | Q = 38.3 nm |
| 1.4 | Q = 44.0 nm | Q = 36.0 nm |

Even where the gate side-wall insulation film 40 is formed, a sufficient width of the control gate electrode (word line) is secured and thus it is possible to avoid a delay in operation speed due to an increase in resistance of the word line.

The shape of the floating gate electrode 13 is determined such that the area of the tunnel insulation film 12 may become 70% or less of the area of the inter-electrode insulation film 20. Thereby, even where the inter-electrode insulation film 20 has a substantially flat structure, it is possible to effectively avoid a malfunction due to an inter-electrode insulation film leak at the time of data write.

For example, consider a cell write operation in a case where a silicon oxide film with a thickness of 8 nm is used as the tunnel insulation film, and a multi-layer film comprising a silicon nitride film/alumina/silicon nitride film structure, which has an equivalent oxide thickness (EOT) of 8 nm, is used as the inter-electrode insulation film. In a case where an electric field, which is applied to the tunnel insulation film, is 12 MV/cm, if the ratio in area between both films is 1.0, the cell coupling ratio is 0.50. Thus, the equivalent electric field, which is applied to the inter-electrode insulation film, is 12 MV/cm. On the other hand, if the ratio between areas is 0.7, the cell coupling ratio is 0.59. Thus, the equivalent electric field, which is applied to the inter-electrode insulation film, is 8.3 MV/cm. Therefore, leakage current hardly flows through the inter-electrode insulation film, and a write malfunction can effectively be prevented.

Next, referring to FIGS. 4A to 4G and FIGS. 5A to 5G, a method of a manufacturing the memory cell structure shown in FIGS. 1A and 1B is described. FIGS. 4A to 4G correspond to the cross section of FIG. 1A, and FIGS. 5A to 5G correspond to the cross section of FIG. 1B.

Figure 4A:
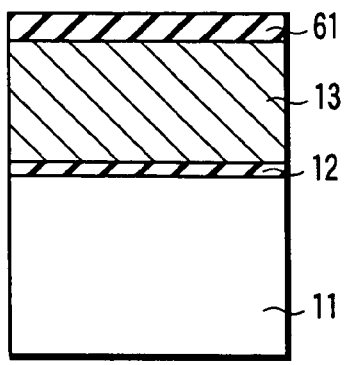
FIG. 4A to 4G are cross-sectional views taken in the channel length (bit line) direction, which illustrate fabrication steps of the nonvolatile memory cell according to the embodiment.
Figure 5A:
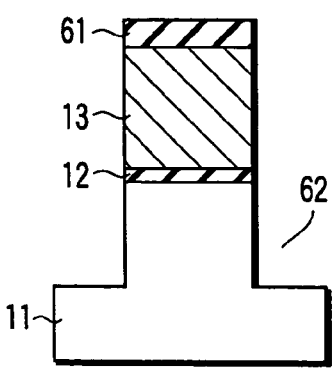
FIG. 5A to 5G are cross-sectional views taken in the channel width (word line) direction, which illustrate fabrication steps of the nonvolatile memory cell according to the embodiment.

To begin with, as shown in FIGS. 4A and 5A, a tunnel insulation film 12 with a thickness of 10 nm is formed by thermal oxidation on a surface of a silicon substrate 11 that is doped with desired impurities. A polysilicon layer (first conductive layer) 13 with a thickness of 40 nm, which will become a floating gate electrode, and an insulation filmed 61, which serves as a stopper for CMP (Chemical Mechanical Polishing), are successively deposited on the tunnel insulation film 12 by low-pressure CVD (Chemical Vapor Deposition). Phosphorus, for instance, was used as dopant impurities in the polysilicon layer 13. Alternatively, other dopant impurities such as arsenic may be used. Then, the stopper insulation film 61, polysilicon layer 13 and tunnel insulation film 12 are successively etched by RIE (Reactive Ion Etching) using a resist mask (not shown). Further, an exposed part of the silicon substrate 11 is etched, and a device isolation groove 62 with a depth of 150 nm is formed.

Figure 4B:
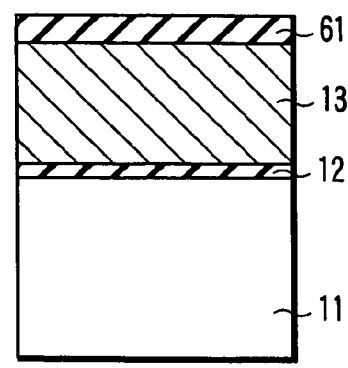
Figure 5B:
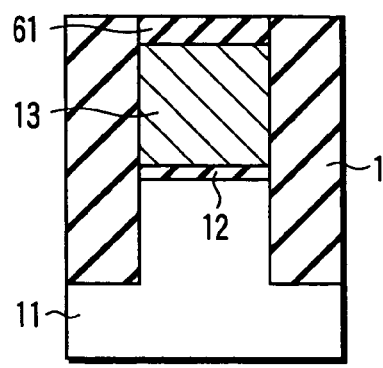

Subsequently, as shown in FIGS. 4B and 5B, a silicon oxide film (device isolation insulation film) 14 with a thickness of 300 nm is deposited on the entire surface of the resultant structure. Thus, the device isolation groove 62 is completely filled with the silicon oxide film 14. Then, a surface portion of the silicon oxide film 14 is polished and flattened by CMP. In this case, the insulation film 61 serving as the CMP stopper is exposed.

Figure 4C:
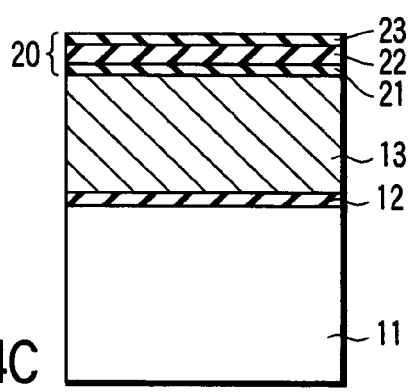
Figure 5C:
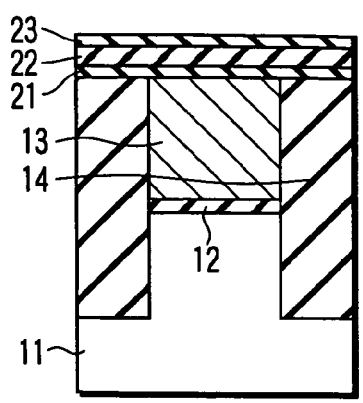

In a fabrication step shown, in FIGS. 4C and 5C, the exposed stopper insulation film 61 is etched away, and the surface of the polysilicon layer 13 is exposed. Then, the exposed surface of the silicon oxide film 14 is etched back using dilute hydrofluoric acid, thereby making the surface level of the silicon oxide film 14 substantially equal to that of the polysilicon layer 13. Thereafter, a first oxidant barrier layer 21 of silicon nitride, an intermediate insulation layer 22 of hafnium oxide and a second oxidant barrier layer 23 of silicon nitride are successively formed by CVD on the entire surface of the structure. These layers 21, 22 and 23 serve as an inter-electrode insulation film 20.

The oxidant barrier layers 21 and 23 function to suppress passage of oxidant. At the time of side wall oxidation (to be described later), the oxidant barrier layers 21 and 23 prevent oxidant from diffusing in the conductive layer via the intermediate insulation layer 22. Thereby, the first oxidant barrier layer 21 prevents oxidant from diffusing in the first conductive layer 13 via the intermediate insulation layer 22, The second oxidant barrier layer 23 prevents oxidant from diffusing in a second conductive layer (to be described later) via the intermediate insulation layer 22.

Figure 4D:
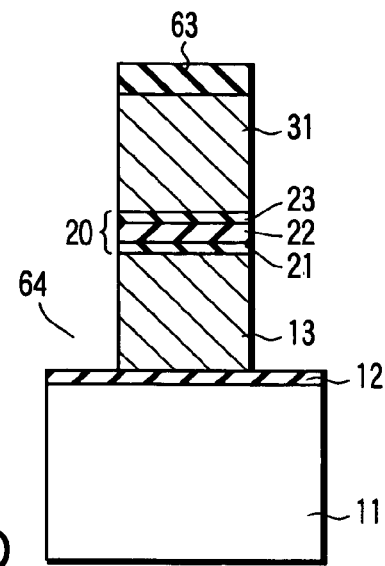
Figure 5D:
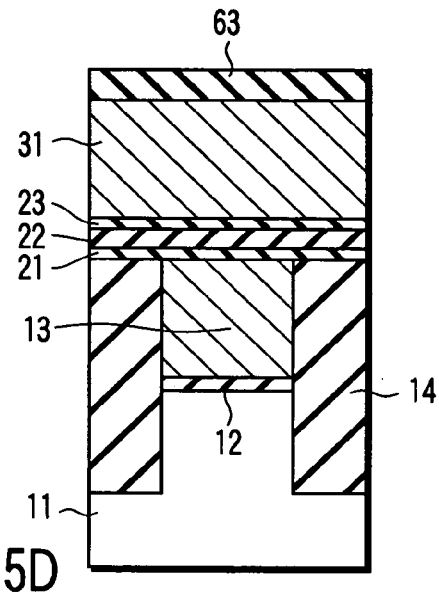

Next, as shown in FIGS. 4D and 5D, a polysilicon layer (second conductive layer) 31, which will become a control gate electrode lower-layer, and a third oxidant barrier layer 63 of silicon nitride are successively deposited by low-pressure CVD on the entire surface of the structure. By means of RIE using a resist mask (not shown), the oxidant barrier layer 63, polysilicon layer 31, inter-electrode insulation film 20 and polysilicon layer 13 are successively etched. Thus, a slit portion 64 in the word line direction is formed. Thereby, the floating gate electrode 13 with a width of about 50 nm and the control gate electrode lower-layer 31 are formed as a stacked-gate structure.

Figure 4E:
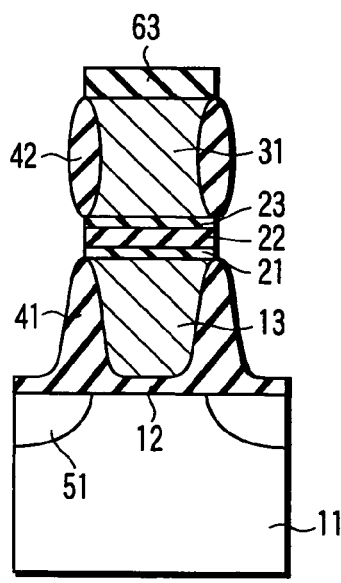
Figure 5E:
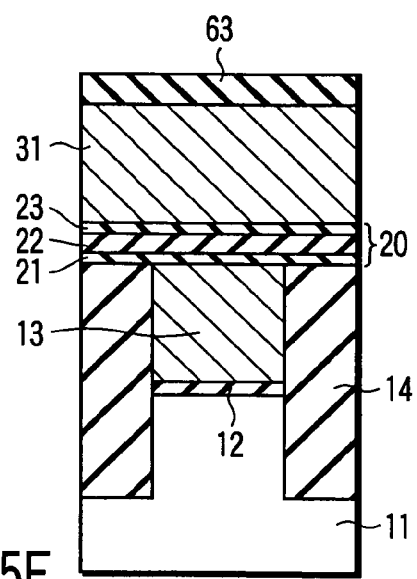

Following the above, as shown in FIGS. 4E and 5E, the exposed surface of the stacked-gate structure is thermally oxidized by RTP (Rapid Thermal Process), and gate side-wall insulation films 40 are selectively formed at side walls of the floating gate electrode 13 and control gate electrode lower-layer 31. At this time, a first side-wall insulation film 41, which is formed at the side wall of the floating gate electrode 13, has a great thickness at the bottom side and a small thickness at the upper side due to the presence of the oxidant barrier layer 21. On the other hand, a second side-wall insulation film 42, which is formed at the side wall of the control gate electrode lower-layer 31, has a great thickness at the central part and a small thickness at the lower and upper end parts due to the presence of the oxidant barrier layers 23 and 63.

The reason for this is as follows. In general, when oxidation is performed from the side surface of a conductive layer that is stacked along with an oxide film, an oxidant enters the conductive layer via the oxide film. As a result, the oxidation reaction at the upper and lower edge part of the conductive layer progresses at a higher rate than the oxidation reaction at the other parts of the conductive layer. However, if an oxidant barrier layer is present in contact with an upper surface or a lower surface of the conductive layer, the barrier layer suppresses the entrance of oxidant into the conductive layer. Accordingly, the oxidation reaction is suppressed at the surface where the oxidant barrier layer is formed. In the present embodiment, the upper surface of the floating gate electrode 13 is provided with the oxidant barrier layer, and the upper and lower surfaces of the control gate electrode lower-layer 31 are provided with the oxidant barrier layers. Thus, as shown in FIGS. 4E and 5E, the upper end part of the side-wall insulation film 41 and the upper and lower end parts of the side-wall insulation film 42 become thin.

In the meantime, oxidation was carried out by RTP in an oxidizing atmosphere at 1000° C. for 30 seconds. The thickness of the side-wall insulation film 41 was very small at the boundary region with the inter-electrodes insulation film 20. The thickness of the film 41 was about 10 nm at the central part of the floating gate electrode 13, and was about 15 nm at the boundary region with the tunnel insulation film 12. In this case, the area of the tunnel insulation film 12 was about 70% of the area of the inter-electrode insulation film 20. The oxidizing gas for RTP is not limited to oxygen, but may be a mixture gas of oxygen and hydrogen. In this case, the oxide is $H_2O$ and the oxidation of the tunnel insulation film side is speeded up.

It is preferable that the gate side-wall insulation film 40 be formed at temperatures of 900° C. or above. Thereby, even if a thick side-wall insulation 41 with a thickness of about 15 nm is formed at a boundary region with the tunnel insulation film 12, bird's beak oxidation hardly occurs in the tunnel insulation film 12. It is thus possible to prevent a substantial increase in thickness of the tunnel insulation film at the time of forming the side-wall insulation film.

Subsequently, using the multi-layer gate structure including the gate side-wall insulation film 40 as a mask, ion implantation is carried out to form source/drain diffusion layers 51. In this case, since the bottom part of the side-wall insulation film 41 had a large width, even when implanted ions entered the inside, a sufficient distance between the source/drain diffusion layers, that is, a sufficient channel length, was secured.

It is preferable that the thickness of the side-wall insulation film 41 (the thickness of side-wall insulation film 41 near the central part of floating gate electrode 13) be set at 20% or more of the height of the floating gate electrode. Thereby, the thickness of the finished side-wall insulation film 41 can sufficiently be increased over a region extending from the central part of the floating gate electrode 13 to the boundary region with the tunnel insulation film 12. By virtue of this, when impurity ions are implanted in the source/drain diffusion layers, the side-wall insulation film can properly function as a mask and can increase the channel length.

Figure 4F:
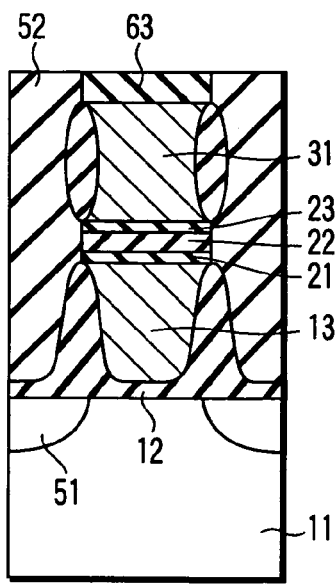
Figure 5F:
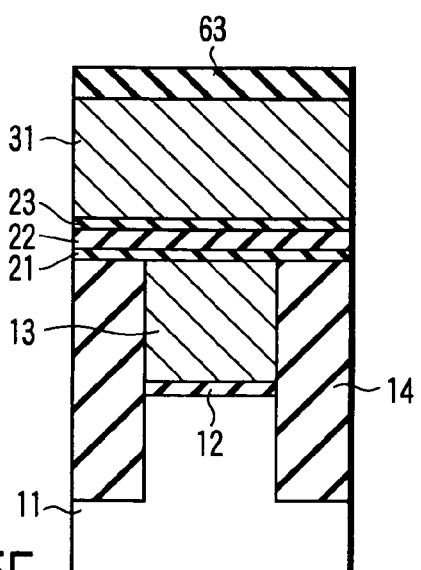

In a subsequent step illustrate in FIGS. 4F and 5F, a silicon oxide film 52 with a thickness of 300 nm for fill-in between electrodes is deposited over the entire surface of the structure, and the inter-electrode slit portion 64 is completely filled with the silicon oxide film 52. Then, a surface portion of the silicon oxide film 52 is polished and flattened by CMP, and the oxidant barrier layer 63 is exposed.

Figure 4G:
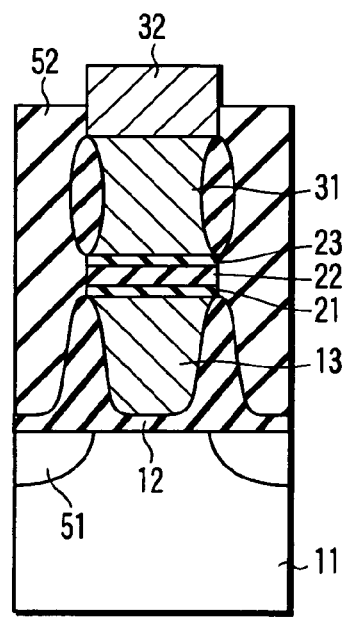
Figure 5G:
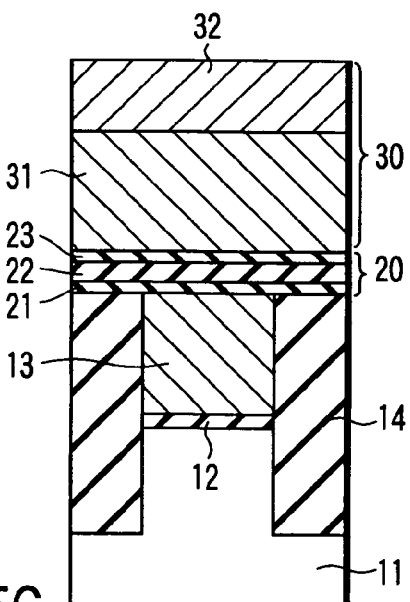
Figure 7A:
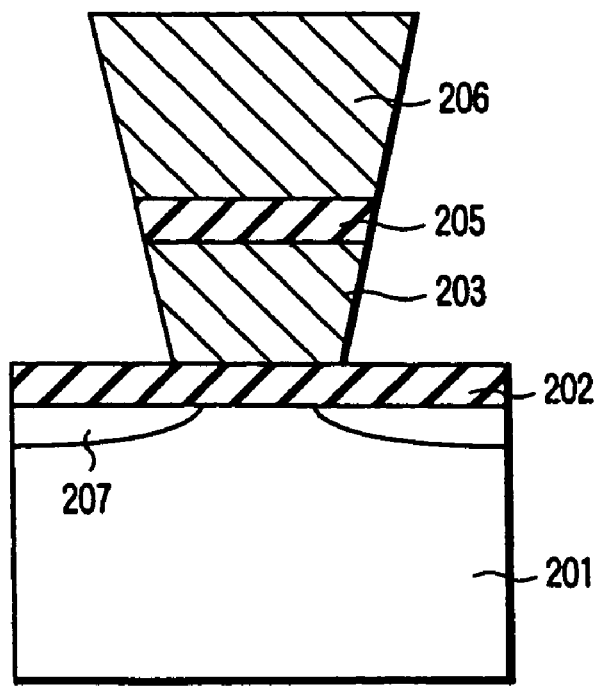
FIG. 7A is a cross-sectional view taken in the channel length (bit line) direction, which illustrates a schematic structure of a prior-art nonvolatile semiconductor memory cell.
Figure 7B:
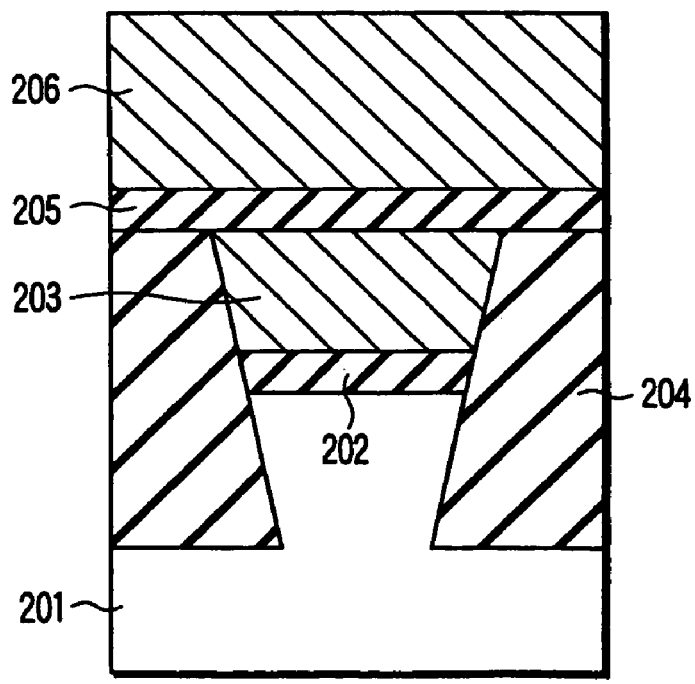
FIG. 7B is a cross-sectional view taken in the channel width (word line) direction, which illustrates a schematic structure of the prior-art nonvolatile semiconductor memory cell.

Thereafter, as shown in FIGS. 4G and 5G, the exposed oxidant barrier layer 63 is etched away, and the surface of the polysilicon layer 31 is exposed. Then, cobalt is sputtered on the entire surface of the structure, and the resultant structure is subjected to high-temperature anneal. Thus, a cobalt silicide layer (third conductive layer) 32, which will becomes a control gate electrode upper-layer, is formed. A non-reacted cobalt layer is then etched away. At last, wiring layers, etc. are formed by well-known methods, and a nonvolatile memory cell is completed.

As has been described above, according to the present embodiment, the inter-electrode insulation film 20 lying between the floating gate electrode 13 and control gate lower-layer 31 is composed of the three-layer structure that includes the first oxidant barrier layer 21, intermediate insulation layer 22 and second oxidant barrier layer 23. In this state, the gate side walls are oxidized. Thereby, the side-wall insulation film 41 at the side wall of the floating gate electrode 13 can be made thick on the substrate side and thin on the inter-electrode insulation film side. Further, the side-wall insulation film 42 at the side wall of the control gate lower-layer 31 can be made thick at the central part and thin at the lower and upper layer sides.

Specifically, the thickness of the side-wall insulation film 41 in a direction parallel to the surface of the substrate is large on the substrate side and small on the inter-electrode insulation film side. This means that the width of the floating gate electrode 13 in the channel length direction is small on the substrate side and is large on the inter-electrode insulation film 20 side. Accordingly, the area of the floating gate electrode 13 on the inter-electrode insulation film 20 side can be made greater than the area of the floating gate electrode 13 on the tunnel insulation film 12 side, and thus the cell coupling ratio can be increased. Moreover, since the substrate-side part of the side-wall insulation film 41 is made thick, the film 41 can be used as a mask for low-temperature ion implantation. Thereby, it is possible to prevent the channel length from being extremely decreased. Therefore, short channel effect can be suppressed, and the control of the threshold voltage value of the cell is made easy. As a result, a write malfunction can surely be prevented.

In the present embodiment, the third oxidant barrier layer 63 is also provided on the control gate electrode lower-layer 31, and the gate side-wall oxidation is performed in this state. Thus, a decrease in area of the control gate electrode 30 can be avoided. Therefore, it is possible to prevent an increase in resistance of the word line due to the gate side-wall oxidation.

There is a possible method by which the thickness of the side-wall insulation film 41 at the side wall of the floating gate electrode 13 can be made large on the bottom side and small on the upper side. In this method, the doping amount of impurities in the floating gate electrode 13 is increased on the bottom side and decreased on the upper side. However, if the impurity concentration at the bottom part of the floating gate electrode 13 is increased, the impurities are diffused into the tunnel insulation film 12, and the characteristics of the tunnel insulation film 12 are deteriorated. By contrast, in the method of the present embodiment wherein the oxidant barrier layers are provided, such drawbacks can be avoided.

Figure 6:
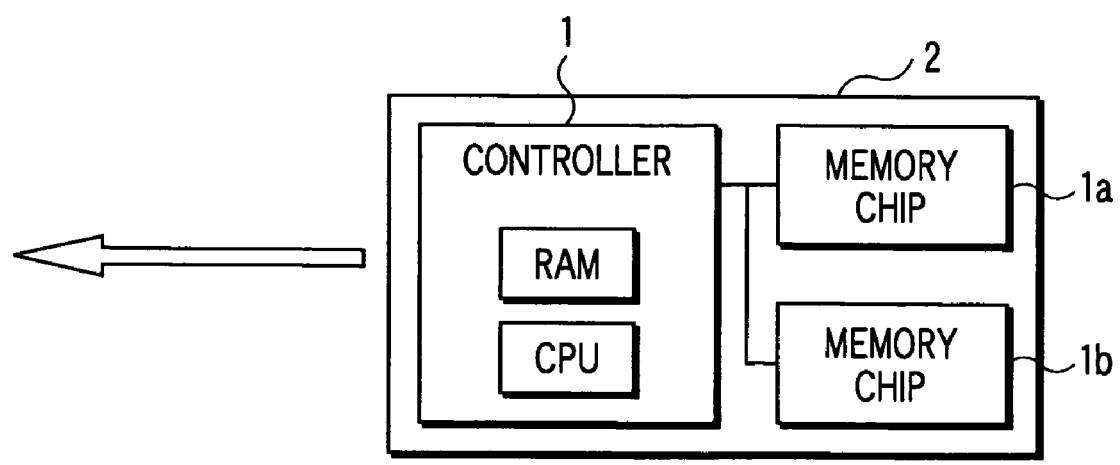
FIG. 6 shows an example of the system configuration of a memory card that uses memory chips each including memory cells shown in FIG. 1.

A memory card can be formed by using the memory cells according to the present embodiment. FIG. 6 shows an example of the system configuration of the memory card.

The memory card 2 is formed such that a controller 1 and a plurality of memory chips 1a and 1b are mounted on the same wiring board. Each of the memory chips 1a and 1b comprises a plurality of NAND cell units. The NAND cell unit comprises a plurality of memory cells according to the above-described embodiment, which are connected in series. The controller 1 includes a RAM and a CPU. The controller 1 is connected to a host interface (not shown). Examples of the host interface are an ATA interface, a PC card interface, USB, etc. The controller 1 is applicable to any type of interface.

In this example, the controller 1 (a microcomputer in general cases) within the memory card 2 controls the operations of the memory cells in the memory chip 1a, 1b, in particular, byte-unit rewrite operations. Specifically, the controller issues commands for byte erase and byte write. These commands are delivered to the memory chips 1a and 1b.

The controller 1 and memory chips 1a and 1b may be integrated as a single chip, or may be formed in separate chips. Alternatively, the controller 1 may be dispensed with, and the memory card may be composed of the memory chip 1a, 1b alone. In general, a digital camera, etc. includes a memory chip card controller. Using the memory chip card controller, data write, data read and data erase can be executed in the memory chip 1a, 1b in the memory card.

(Modification)

The present invention is not limited to the above-described embodiment. In the embodiment, the oxidation method such as RTP is used in forming the gate side-wall insulation film. Alternatively, an oxinitride film may be formed by an oxynitridation method. A gas to be used in this case may be nitrous oxide ($N_2O$) gas or nitric oxide (NO) gas. Alternatively, radical oxidation or radial oxynitridation may be adopted.

The oxidant barrier layer may be formed of, instead of silicon nitride, silicon oxynitride, titanium nitride, tungsten nitride, etc. In addition, a multi-layer film of these materials may be used. In the present embodiment, the inter-electrode insulation film has a substantially flat structure, but this invention is not limited to this structure. There may be a stepped part between the upper surface of the polysilicon layer of the floating gate electrode and the upper surface of the silicon oxide film for device isolation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a nonvolatile semiconductor memory cell, comprising:

forming a tunnel insulation film on a semiconductor substrate;

forming on the tunnel insulation film a first conductive layer that becomes a floating gate electrode;

forming on the first conductive layer an inter-electrode insulation film that includes a first oxidant barrier layer, which suppresses passage of oxidant, an intermediate insulation layer, and a second oxidant barrier layer, which suppresses passage of oxidant;

forming on the inter-electrode insulation film a second conductive layer that becomes a control gate electrode;

forming a stacked-gate structure by selectively etching the first conductive layer, the second conductive layer and the inter-electrode insulation film; and forming gate side-wall insulation films on side parts of the floating gate electrode by oxidizing or oxynitriding side surfaces of the stacked-gate structure, each of the gate side-wall insulation films having a thickness increasing from the inter-electrode insulation film side toward the tunnel insulation film side, wherein after formation of the gate side-wall insulation films, source/drain diffusion layers are formed by implanting dopant ions in the semiconductor substrate, using the gate side-wall insulation films as a mask.

2. The method according to claim 1, wherein a third oxidant barrier layer is formed on the second conductive layer, prior to formation of the gate side-wall insulation films.

3. The method according to claim 1, wherein a third oxidant barrier layer is formed on the second conductive layer, prior to formation of the gate side-wall insulation films, and oxidation or oxynitridation is performed to form the gate side-wall insulation films in a state in which the third oxidant barrier layer is present on the second conductive layer.

4. The method according to claim 3, wherein the third oxidant barrier layer is removed after formation of the gate side-wall insulation films, and a third conductive layer having a lower resistance than the second conductive layer is formed on the second conductive layer.

5. The method according to claim 1, wherein the conductive layers are thermally oxidized by RTP (Rapid Thermal Process), thereby to form the gate side-wall insulation films.

6. A method of manufacturing a nonvolatile semiconductor memory cell, comprising:

forming a tunnel insulation film on a semiconductor substrate;

forming on the tunnel insulation film a first conductive layer that becomes a floating gate electrode;

forming on the first conductive layer an inter-electrode insulation film that includes a first oxidant barrier layer, which suppresses passage of oxidant, an intermediate insulation layer, and a second oxidant barrier layer, which suppresses passage of oxidant;

forming on the inter-electrode insulation film a second conductive layer that becomes a control gate electrode lower-layer;

forming a third oxidant barrier layer on the second conductive layer;

forming a stacked-gate structure by selectively etching the first conductive layer, the second conductive layer, the inter-electrode insulation film, and the third oxidant barrier layer;

forming first gate side-wall insulation films on side parts of the floating gate electrode and second gate side-wall insulation films on side parts of the control gate electrode lower-layer by oxidizing or oxynitriding side surfaces of the stacked-gate structure, each of the first gate side-wall insulation films having a thickness increasing from the inter-electrode insulation film side toward the tunnel insulation film side, and each of the second gate side-wall insulation films having a thickness decreasing from a central part thereof toward the oxidant barrier layers; and removing the third oxidant barrier layer and then forming on the control gate electrode lower-layer a control gate electrode upper-layer that has a lower resistance than the control gate electrode lower-layer, wherein after formation of the gate side-wall insulation films, source/drain diffusion layers are formed by implanting dopant ions in the semiconductor substrate, using the gate side-wall insulation films as a mask.

7. A method of manufacturing a nonvolatile semiconductor memory cell, comprising:

forming a tunnel insulation film on a semiconductor substrate;

forming on the tunnel insulation film a first conductive layer that becomes a floating gate electrode;

forming on the first conductive layer an inter-electrode insulation film that includes a first oxidant barrier layer, which suppresses passage of oxidant, an intermediate insulation layer, and a second oxidant barrier layer, which suppresses passage of oxidant;

forming on the inter-electrode insulation film a second conductive layer that becomes a control gate electrode;

forming a stacked-gate structure by selectively etching the first conductive layer, the second conductive layer and the inter-electrode insulation film; and forming gate side-wall insulation films on side parts of the floating gate electrode by oxidizing or oxynitriding side surfaces of the stacked-gate structure, each of the gate side-wall insulation films having a thickness increasing from the inter-electrode insulation film side toward the tunnel insulation film side, wherein the inter-electrode insulation film has as substantially flat structure, and an area of the tunnel insulation film, which contacts the floating gate electrode, is 70% or less of an area of the inter-electrode insulation film, which contacts the floating gate electrode.

8. The method according to claim 7, wherein a third oxidant barrier layer is formed on the second conductive layer, prior to formation of the gate side-wall insulation films.

9. The method according to claim 7, wherein a third oxidant barrier layer is formed on the second conductive layer, prior to formation of the gate side-wall insulation films, and oxidation or oxynitridation is performed to form the gate side-wall insulation films in a state in which the third oxidant barrier layer is present on the second conductive layer.

10. The method according to claim 9, wherein the third oxidant barrier layer is removed after formation of the gate side-wall insulation films, and a third conductive layer having a lower resistance than the second conductive layer is formed on the second conductive layer.

11. The method according to claim 7, wherein the conductive layers are thermally oxidized by RTP (Rapid Thermal Process), thereby to form the gate side-wall insulation films.

12. A method of manufacturing a nonvolatile semiconductor memory cell, comprising:

forming a tunnel insulation film on a semiconductor substrate;

forming on the tunnel insulation film a first conductive layer that becomes a floating gate electrode;

forming on the first conductive layer an inter-electrode insulation film that includes a first oxidant barrier layer, which suppresses passage of oxidant, an intermediate insulation layer, and a second oxidant barrier layer, which suppresses passage of oxidant;

forming on the inter-electrode insulation film a second conductive layer that becomes a control gate electrode lower-layer;

forming a third oxidant barrier layer on the second conductive layer;

forming a stacked-gate structure by selectively etching the first conductive layer, the second conductive layer, the inter-electrode insulation film, and the third oxidant barrier layer;

forming first gate side-wall insulation films on side parts of the floating gate electrode and second gate side-wall insulation films on side parts of the control gate electrode lower-layer by oxidizing or oxynitriding side surfaces of the stacked-gate structure, each of the first gate side-wall insulation films having a thickness increasing from the inter-electrode insulation film side toward the tunnel insulation film side, and each of the second gate side-wall insulation films having a thickness decreasing from a central part thereof toward the oxidant barrier layers; and removing the third oxidant barrier layer and then forming on the control gate electrode lower-layer a control gate electrode upper-layer that has a lower resistance than the control gate electrode lower-layer, wherein the inter-electrode insulation film has as substantially flat structure, and an area of the tunnel insulation film, which contacts the floating gate electrode, is 70% or less of an area of the inter-electrode insulation film, which contacts the floating gate electrode.

* * * * *